US012674820B2

(12) United States Patent
Sicard et al.

(10) Patent No.: US 12,674,820 B2
(45) Date of Patent: Jul. 7, 2026

(54) DEVICE FOR MEASURING ELECTRICAL QUANTITIES IN AN ELECTRICAL INSTALLATION AND ASSOCIATED SYSTEM

(71) Applicant: Schneider Electric Industries SAS, Rueil Malmaison (FR)

(72) Inventors: Stéphane Sicard, La Mure (FR); Jonathan Caillou, La Buisse (FR); Brandon Alves, Saint Martin d'Heres (FR); Juliette Koch, Grenoble (FR); Stéphane Wolozan, Echirolles (FR); Loïc Rondot, Meylan (FR)

(73) Assignee: Schneider Electric Industries SAS, Rueil Malmaison (FR)

(*) Notice: Subject to any disclaimer, the term of this patent is extended or adjusted under 35 U.S.C. 154(b) by 86 days.

(21) Appl. No.: 18/431,036

(22) Filed: Feb. 2, 2024

(65) Prior Publication Data
US 2024/0272202 A1     Aug. 15, 2024

(30) Foreign Application Priority Data

Feb. 13, 2023    (FR) ...................................... 2301315

(51) Int. Cl.
*G01R 15/12*          (2006.01)
*G01R 1/04*           (2006.01)
(Continued)

(52) U.S. Cl.
CPC ............... *G01R 15/12* (2013.01); *G01R 1/04* (2013.01); *G01R 15/16* (2013.01); *G01R 15/18* (2013.01)

(58) Field of Classification Search
CPC ........ G01R 15/12; G01R 15/16; G01R 15/18; G01R 15/142; G01R 1/04; G01R 19/165; G01R 21/006; G01R 21/001
See application file for complete search history.

(56) References Cited

U.S. PATENT DOCUMENTS 11,137,420 B2 * 10/2021 Chansavang ........ G01R 22/065
11,567,111 B2 *  1/2023 Beishline ............ G01R 22/061
(Continued)

FOREIGN PATENT DOCUMENTS

GB          2548863 A  * 10/2017 ............. G01R 19/14

OTHER PUBLICATIONS

French Search Report and Written Opinion dated Aug. 24, 2023 for corresponding French Patent Application No. FR2301315, 7 pages.

*Primary Examiner* — Dominic E Hawkins

(74) *Attorney, Agent, or Firm* — Patterson + Sheridan, LLP

(57)          ABSTRACT

A device for measuring electrical quantities in an electrical installation. The device is integrated in a housing including at least one unitary block, the unitary block including a through-slot suitable for receiving an electrical conductor of the electrical installation, the through-slot extending along a main axis. Each unitary block includes: a current measurement module, configured to measure an electrical current flowing in the electrical conductor; a voltage measurement module for measuring voltage through capacitive coupling; and a power supply module, configured to pick up an electrical energy from the electrical conductor, the modules being arranged around the through-slot. The device is configured to obtain at least one electrical quantity on the basis of the current and voltage measurements, and to transmit the at least one electrical quantity via a communication interface.

20 Claims, 10 Drawing Sheets

(51) Int. Cl.
   *G01R 15/16*        (2006.01)
   *G01R 15/18*        (2006.01)

(56)             References Cited

U.S. PATENT DOCUMENTS

| | | |
|---|---|---|
| 2012/0200291 A1 | 8/2012 | Carpenter et al. |
| 2014/0209352 A1 | 7/2014 | Trittschuh, III et al. |
| 2015/0002138 A1* | 1/2015 | Fox ...................... G01R 15/142 |
| | | 324/149 |
| 2022/0393721 A1* | 12/2022 | Braginsky ......... H02J 13/00007 |

* cited by examiner

DEVICE FOR MEASURING ELECTRICAL QUANTITIES IN AN ELECTRICAL INSTALLATION AND ASSOCIATED SYSTEM

TECHNICAL FIELD

The present invention relates to a device for measuring electrical quantities in an electrical installation, said device being integrated in a housing comprising at least one unitary block, the unitary block comprising a through-slot suitable for receiving an electrical conductor of said electrical installation.

The invention concerns the field of measuring and computing electrical quantities, in a distributed manner, in an electrical installation.

BACKGROUND

The reason is that, in some electrical installations, for example local electricity distribution grids, it is useful to measure electrical quantities, in particular electrical current and voltage, on various electrical conductors, at multiple locations in the grid, and to compute other electrical quantities, e.g. power, energy, etc.

Devices for measuring electrical quantities, e.g. current and voltage sensors, are known by way of example that have the ability to communicate the measured electrical quantities, allowing a communication network to be implemented between measuring devices and a gateway communication device, thereby facilitating the supervision and control of the electrical grid by users.

Furthermore, in a distributed communication network such as this, other electrical quantities may advantageously be computed on the basis of the current and voltage values measured by such sensors.

However, installing and maintaining such current and voltage sensor devices in an electrical installation, in particular for an electrical installation comprising a plurality of loads and sources, which are connected in multiple connection stages, using a plurality of electrical conductors, may turn out to be costly, in terms of time and labour, owing to the need to install a large number of sensors, and to carry out unplugging operations for the electrical conductors of the installation.

There is therefore a need to facilitate the handling, installation and maintenance of devices for measuring electrical quantities.

SUMMARY

To this end, the invention proposes, according to one aspect, a device for measuring electrical quantities in an electrical installation, said device being integrated in a housing comprising at least one unitary block, the unitary block comprising a through-slot suitable for receiving an electrical conductor of said electrical installation, the through-slot extending along a main axis. The or each unitary block comprises:

a current measurement module, configured to measure an electrical current flowing in said electrical conductor,
 a voltage measurement module for measuring voltage through capacitive coupling,
 a power supply module, configured to pick up an electrical energy from said electrical conductor, said modules being arranged around said through-slot intended to receive the electrical conductor, the unitary block moreover comprising an electronic device, comprising a wireless communication interface suitable for communicating according to a predetermined wireless communication protocol and a programmable electronic circuit,
the electronic device being supplied with electrical energy by said power supply module, the programmable electronic circuit being configured to receive, continuously, current and voltage measurements from said current and voltage measurement modules, and to control the transmission by said communication interface of at least one electrical quantity associated with the electrical signal flowing in the electrical conductor received in the through-slot, which electrical quantity is obtained on the basis of said current and voltage measurements.

Advantageously, the measurement device proposed provides both current measurement courtesy of the presence of the current measurement module and voltage measurement courtesy of the presence of the voltage measurement device.

Advantageously, the proposed device for measuring electrical quantities is of the self-powered type courtesy of the presence of the supply module. Thus, no auxiliary power supply is needed, nor any cable dedicated to this purpose.

Advantageously, the proposed device for measuring electrical quantities incorporates a wireless communication interface and a programmable electronic circuit. Thus, the proposed device for measuring electrical quantities is independent for a plurality of functionalities.

The device for measuring electrical quantities according to the invention may have one or more of the features hereinbelow, taken independently or according to any of the acceptable combinations.

The electrical quantity is a current, a voltage, an active or reactive power, an electrical energy, a frequency, a power factor, or a harmonic distortion of the electrical signal.

The or each unitary block is arranged as a first portion and a second portion put together, said first and second portions being at least partially separable from one another, so as to allow said unitary block to be opened and closed, said first and second portions cooperating to form the through-slot.

The first and second portions are linked by at least one pivot having two axes of rotation.

The current measurement module and the power supply module are stacked in the direction defined by the main axis, and the module comprises a first hollow part and the power supply module comprises a second hollow part, said first and second hollow parts being centred around the main axis and forming the through-slot.

The voltage measurement module comprises a sensor extending in the through-slot in the direction of the main axis and a support connected to said sensor and to the electronic device, forming a voltage sensor through capacitive coupling with the electrical conductor.

The current measurement module comprises a current sensor, the current sensor comprising a main coil of conductor wire, and a ferromagnetic element of curved shape, comprising a rounded central portion and two arms of the same length extending on either side of the rounded central portion, the ferromagnetic element having an axis of symmetry parallel to each of the arms, the main coil extending in a direction perpendicular to said axis of symmetry, and being disposed between said arms of the ferromagnetic element.

The current sensor is configured to open into two parts, a first part comprising at least the main coil and said arms, and a second part comprising the rounded central portion.

The main coil has a first end and a second end, said arms of the ferromagnetic element being a first arm and a second arm, respectively, the sensor moreover comprising compensating coils, disposed on either side of the main coil, between the first end of the main coil and the first arm and between the second end of the main coil and the second arm, respectively.

The power supply module comprises a current transformation unit comprising a magnetic current transformer having an equivalent magnetizing inductance, an AC/DC conversion unit comprising a compensating capacitor, referred to as a compensation capacitor, configured to compensate for a loss of energy due to the magnetic current transformer, and an electrical energy storage unit.

The power supply module moreover comprises an impedance matching unit connected between the conversion unit and the energy storage unit.

The conversion unit is a voltage multiplier unit comprising the compensation capacitor and a blocking diode connected to the output of the compensation capacitor, the compensation capacitor having a capacitance chosen to compensate for the equivalent magnetizing inductance of the magnetic current transformer.

According to another aspect, the invention relates to a system for computing electrical quantities in an electrical installation, comprising a plurality of devices for measuring electrical quantities as briefly described above and a gateway communication device, which are configured to communicate according to a chosen wireless communication protocol.

BRIEF DESCRIPTION OF THE DRAWINGS

Other features and advantages of the invention will emerge from the description thereof provided hereinbelow, by way of illustration and by no means limiting, with reference to the appended figures, among which.

DETAILED DESCRIPTION

Figure 1:
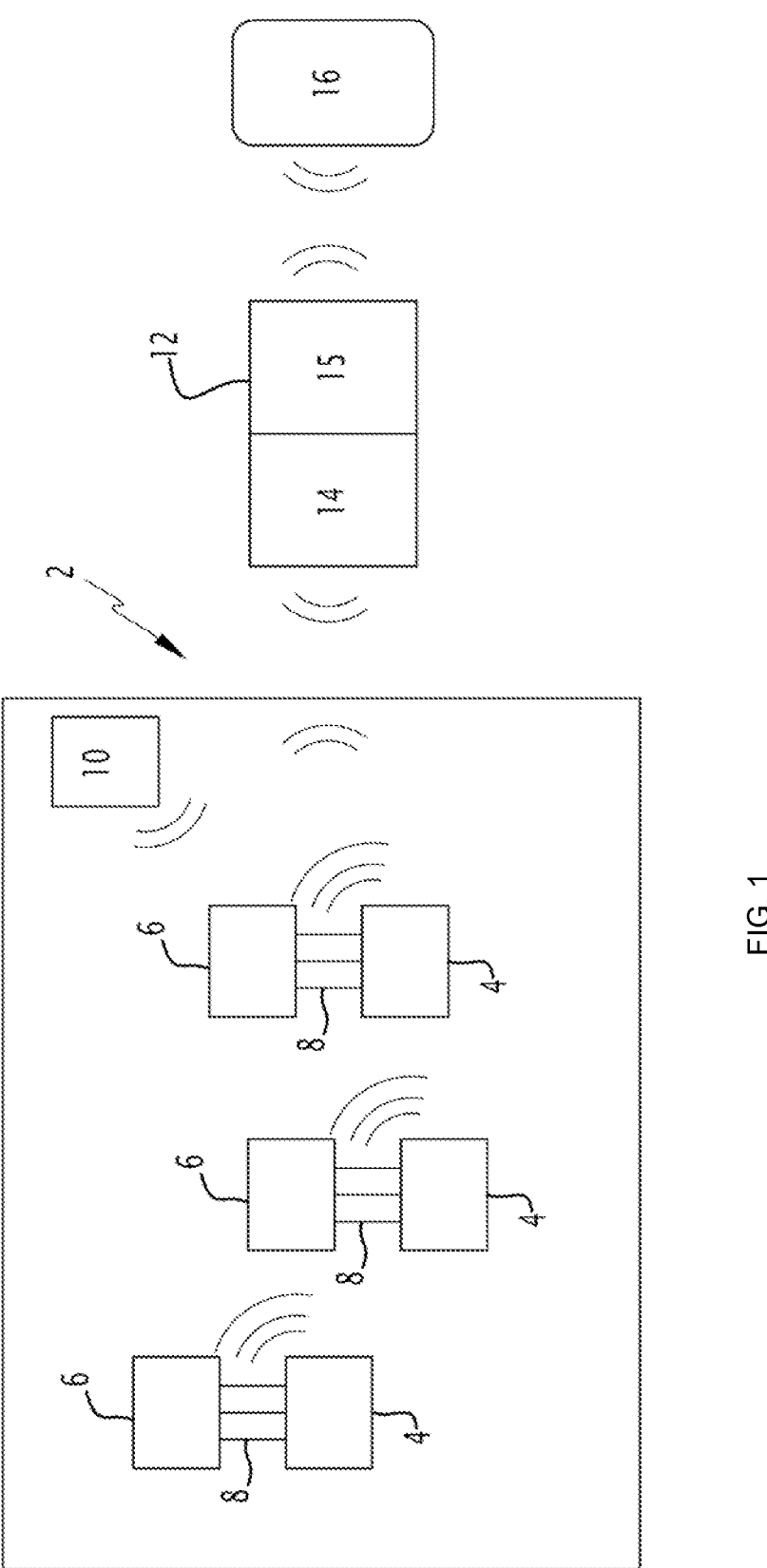
FIG. 1 schematically shows a system for computing electrical quantities that is distributed in an electrical installation.

FIG. 1 schematically illustrates a system 2 for computing electrical quantities that is distributed in an electrical installation.

The electrical installation, which is not shown in FIG. 1, is for example a domestic electricity distribution installation or a commercial or administrative building electricity distribution installation that is configured to provide an electrical energy and loads, connected by means of electrical conductors, that consume electrical energy from one or more electrical energy sources, comprising in particular a public electricity distribution grid, and, optionally, local sources, e.g. photovoltaic panels.

The electrical conductors are for example cables or conductor rails made of electrically conductive material.

The electrical installation may be a single-phase or poly-phase installation comprising a number N of electrical current phases, with or without a neutral conductor.

In the single-phase case, additional adaptations, for example connection to a reference potential, are introduced.

In the schematic representation in FIG. 1, the system 2 for computing electrical quantities comprises a plurality of devices 4 for measuring electrical quantities. Each device 4 for measuring electrical quantities is connected, in the example illustrated, to an electrical protection device 6, for example a circuit breaker.

For example, in one embodiment, all of the circuit breakers 6 and devices 4 for measuring electrical quantities are placed in an electrical panel or in an electrical cabinet.

The devices 4 for measuring electrical quantities will be described in more detail hereinafter.

In particular, each device 4 is equipped with a wireless communication interface. In other words, each device 4 is a device that is able to communicate, being equipped with a communication capability, according to a chosen wireless protocol, with the other devices of the system 2 for computing electrical quantities that are able to communicate.

For example, the wireless communication protocol implemented is the Bluetooth® protocol, or the Zigbee Green Power protocol.

As described in more detail below, each device 4 is configured to take measurements of electrical quantities characterizing the electrical signal that flows in the or in each electrical conductor 8 of the electrical installation to be monitored. In particular, each device 4 is configured to continuously provide measurements of electrical current on the or on each of the electrical conductors 8 to which it is connected, and is configured to continuously take a measurement of voltage through capacitive coupling.

Furthermore, each device 4 comprises a programmable electronic circuit, e.g. a microprocessor, configured to compute chosen electrical quantities.

The system 2 moreover comprises, in one embodiment, a single device 10 for measuring voltage through contact, equipped with a communication interface, so as to allow the continuously taken voltage measurements to be broadcast to the devices 4 for measuring electrical quantities, thereby allowing the precision of the voltage measurements in the system to be improved.

The system 2 moreover comprises a gateway communication device 12, comprising a first communication interface 14 configured to communicate according to the wireless communication protocol used by the devices 4 for measuring electrical quantities, so as to communicate bidirectionally with these devices 4.

Moreover, the gateway communication device 12 comprises a second communication interface 15, configured to communicate, for example according to another communication protocol, for example a wireless communication protocol, with one or more user devices 16.

For example, the second communication protocol is of wireless (Bluetooth, ZigBee, WiFi), or wired, e.g. Ethernet cable, type.

Thus, a user, for example a maintenance operator, is capable of receiving, via the user device 16, measurements of electrical quantities obtained, allowing the supervision, monitoring of correct operation, or planning of predictive maintenance of the electrical installation concerned.

The measurements provided are for example displayed on a human-machine interface of the user device 16.

Advantageously, the devices 4 for measuring electrical quantities are devices with an independent power supply, and it is therefore not necessary to connect them to a power source by wire, using a cable or more generally using an electrical conductor.

Figure 2:
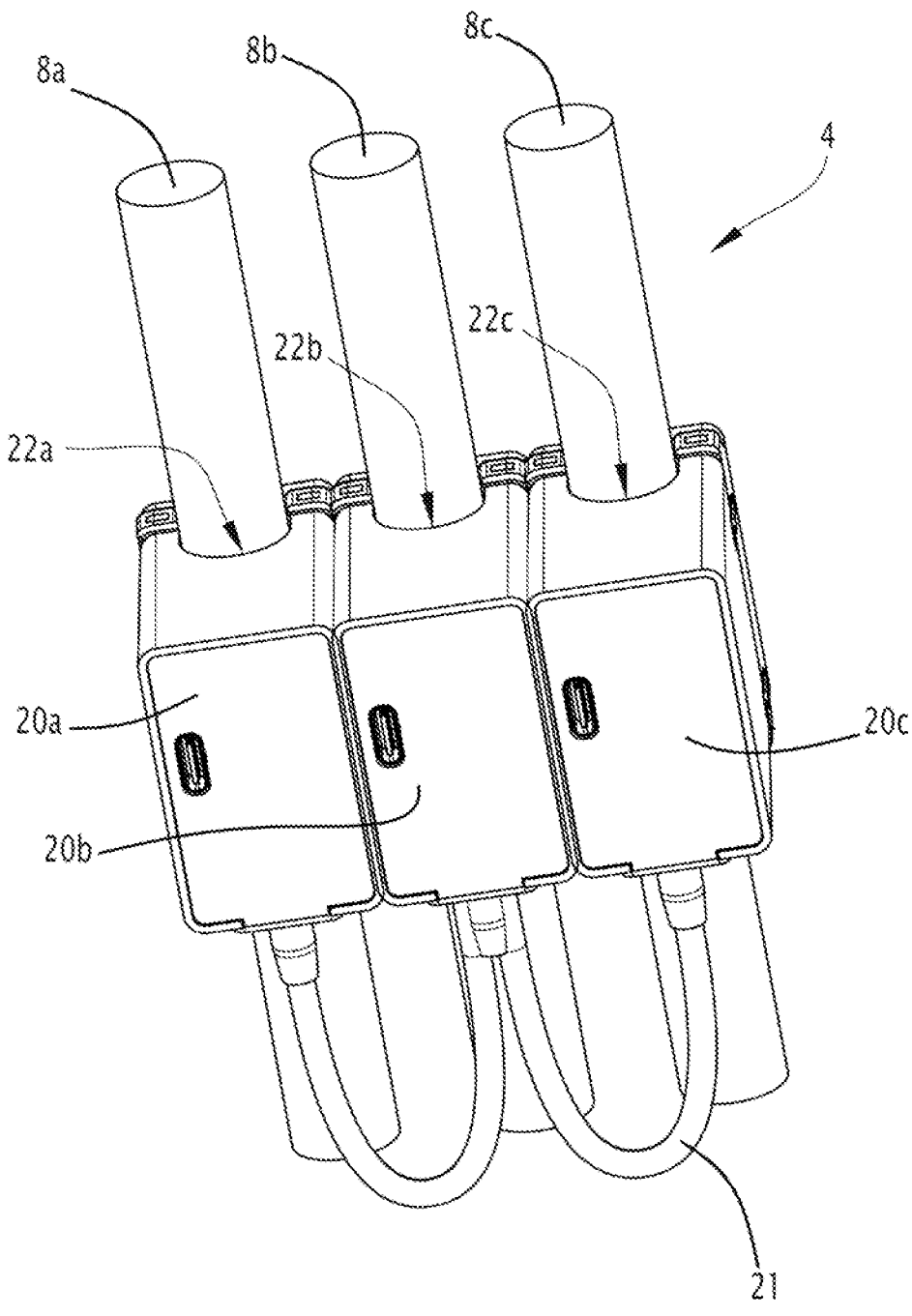
FIG. 2 is a perspective view of a device for measuring electrical quantities according to one embodiment.

FIG. 2 illustrates a device 4 for measuring electrical quantities.

In the example of FIG. 2, the device 4 is integrated in a housing comprising three unitary blocks 20a, 20b, 20c. This device 4 is suitable for a three-phase electrical installation, each unitary block being configured to receive a respective electrical conductor 8a, 8b, 8c in a through-slot 22a, 22b, 22c provided for this purpose, the associated electrical conductor being a conductor of one of the phases of a three-phase electrical current.

As illustrated in FIG. 2, the respective unitary blocks 20a, 20b, 20c are arranged side by side, and for example secured at the side.

Furthermore, a series electrical connection is made between the respective unitary blocks 20a, 20b, 20c by means of an electrical conductor 21.

In the remainder of the description, a device 4 for measuring electrical quantities that is integrated in a housing comprising a unitary block 20, and configured to measure current and voltage on the basis of a phase conductor, will be described.

The embodiments described apply analogously to a device 4 comprising a plurality of similar unitary blocks.

In a particularly advantageous embodiment, the or each unitary block 20 is of the type that opens, and therefore the device 4 is one that opens.

Figure 3:
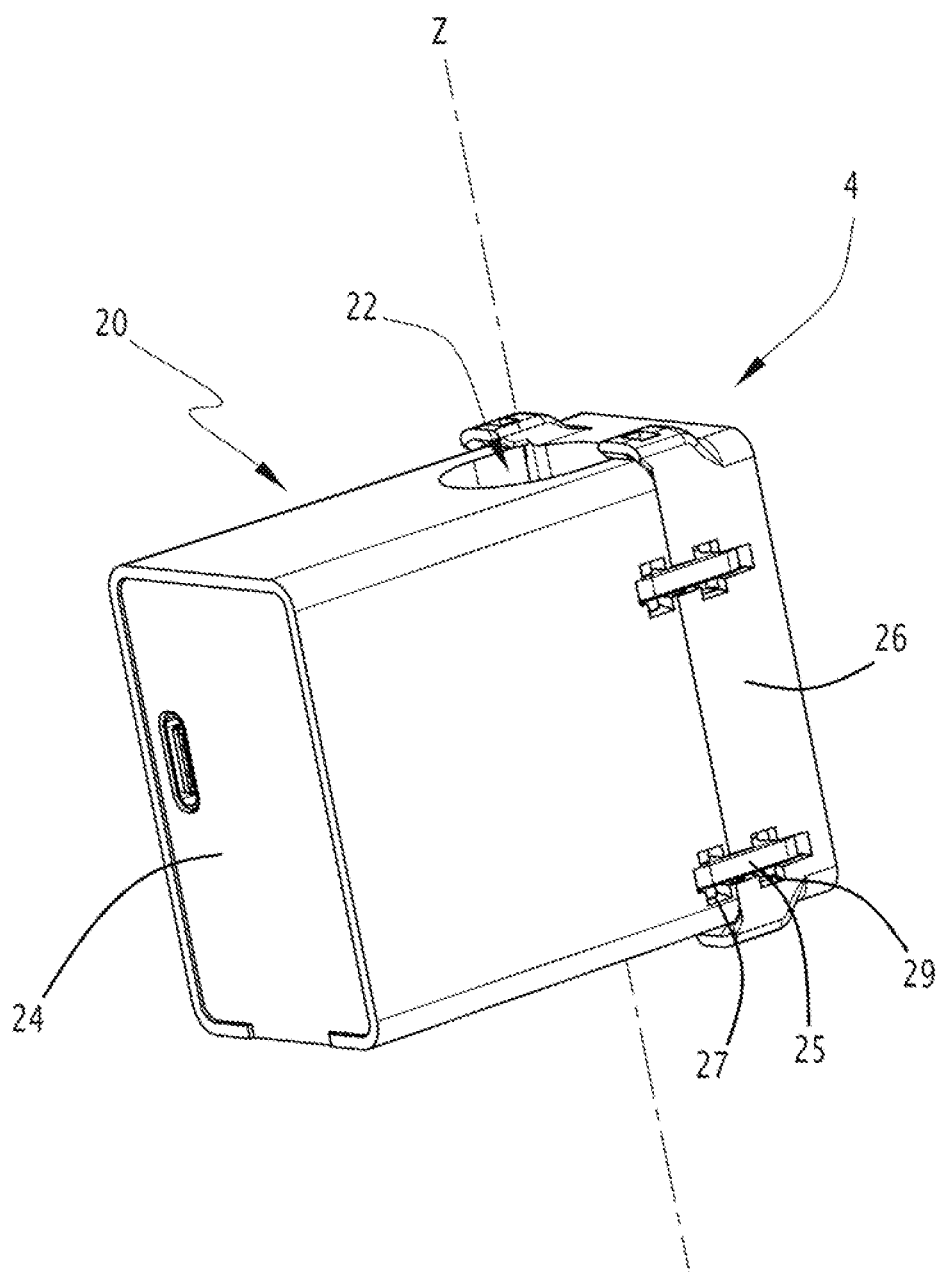
FIG. 3 is a perspective view of a unitary block of a device for measuring electrical quantities in a closed position.
Figure 4:
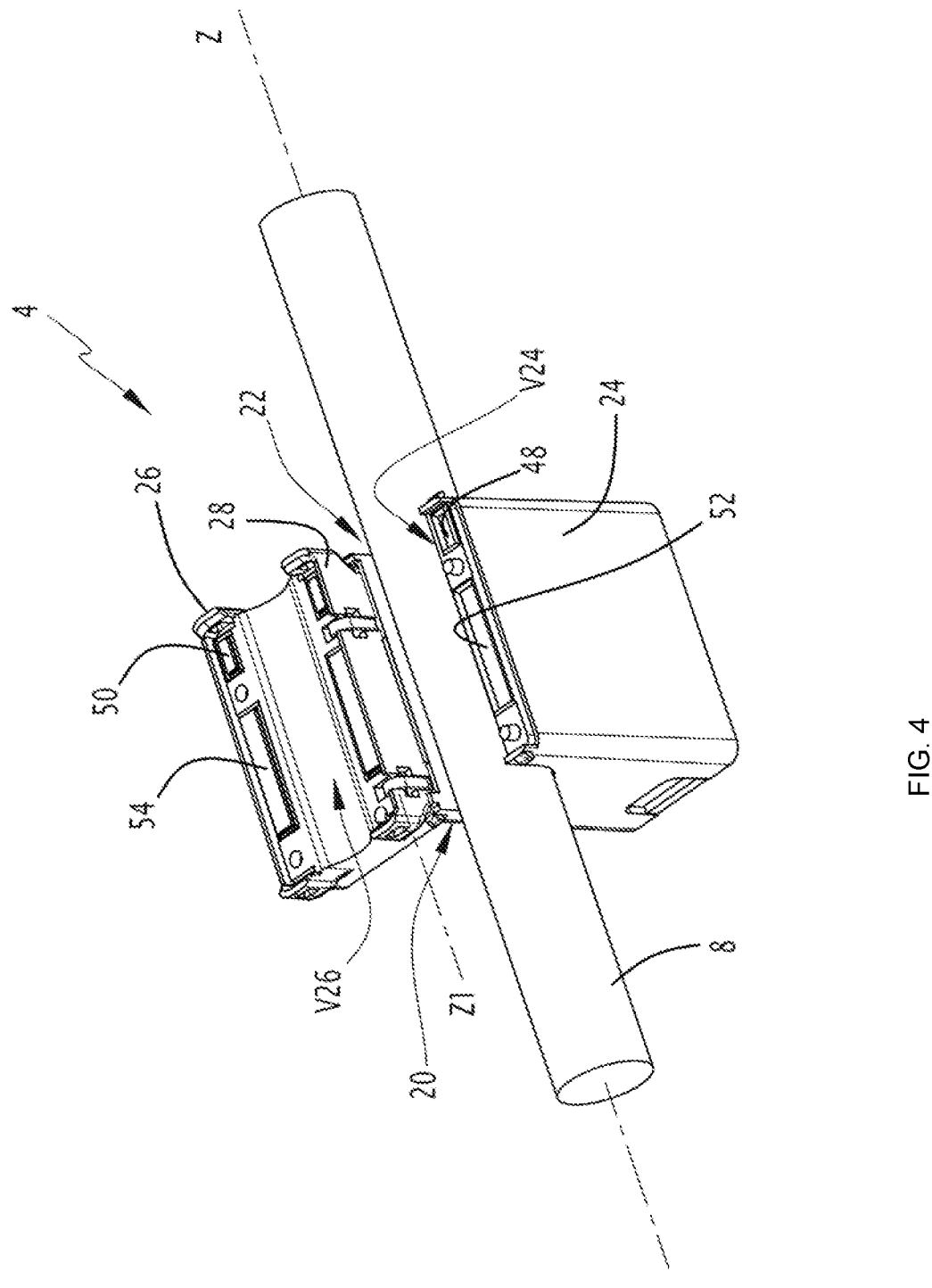
FIG. 4 is a perspective view of a unitary block of a device for measuring electrical quantities in an open position.

Thus, in this embodiment, advantageously, the unitary block 20 is arranged as a first portion 24 and a second portion 26, which cooperate in order to be put together and form a unitary block 20, shown in the closed position in FIG. 3, and that are at least partially separable as illustrated in FIG. 4.

In the example of FIG. 3, the first portion 24 and the second portion 26 are secured by mechanical closure (or "snap-fit") elements.

A first internal volume V24 is defined inside the first portion 24 of the unitary block 20, and a second internal volume V26 is defined inside the second portion 26.

The through-slot 22 intended to receive the associated electrical conductor 8 extends along a main axis Z, the direction of which is called the longitudinal direction below.

For example, in the embodiment in FIG. 4, the unitary block 20 has a substantially parallelepipedal shape, in other words the cross-section, in a plane orthogonal to the main axis Z, is substantially rectangular.

Of course, this is an example of a geometric shape, but other geometric shapes can be envisaged.

In one embodiment, as illustrated in FIG. 3, the first portion 24 and the second portion 26 are secured by a pivot system 25 having two axes of rotation 27, 29.

In an alternative embodiment, the first portion 24 and the second portion 26 are linked by a hinge 28 so that the second portion 26 is able to be moved around an axis of rotation Z1, parallel to the main axis Z, and to be folded down on the first portion 24 in order to be put together to form a unit. The hinge is formed on a lateral side face of the unitary block 20.

The first and second portions 24, 26 cooperate in order to form the through-slot 22, as illustrated in FIG. 4.

For example, if the through-slot 22 is of substantially tubular shape, for example of circular or rectangular section with rounded angles in a plane orthogonal to the main axis Z, the first portion 24 comprises a hollow part forming a first half-tube in the longitudinal direction, and the second portion 26 comprises a hollow part forming a second half-tube in the longitudinal direction. The combined first and second half-tubes form the through-slot 22 when the first portion 24 and the second portion 26 are in the closed position, as illustrated in FIG. 3.

Thus, advantageously, in this embodiment, the device 4 for measuring physical quantities is one that opens, since the unitary block 20 is one that opens, thereby allowing the electrical conductor 8 on which the device 4 is placed to be surrounded in order to take measurements.

In an embodiment in which the device 4 comprises multiple unitary blocks 20, the unitary blocks are of the same shape and the same dimensions and are suitable for being opened, and then closed, firmly.

Advantageously, this allows easy installation of the device 4 for measuring physical quantities on an electrical conductor already connected in an electrical installation without having to disconnect (or unplug) this conductor of the electrical installation.

According to one variant, the first portion 24 and the second portion 26 are completely separable in translation, and are configured to be joined together by snap-fitting.

According to another variant, one of the portions is movable relative to the other, and is configured to slide in a track.

Figure 5:
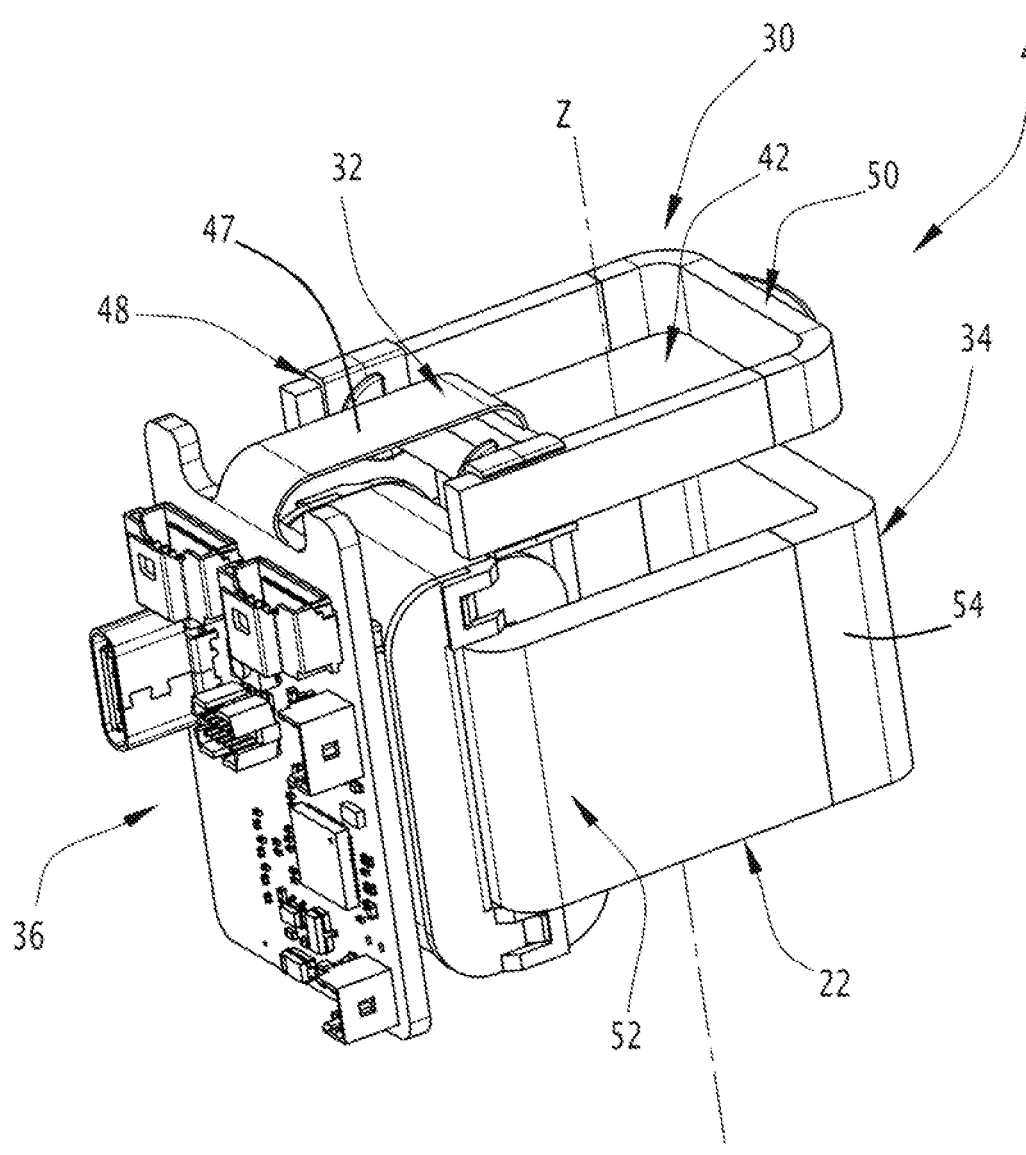
FIG. 5 is a first perspective view of a device for measuring electrical quantities, without a housing, according to one embodiment.
Figure 6:
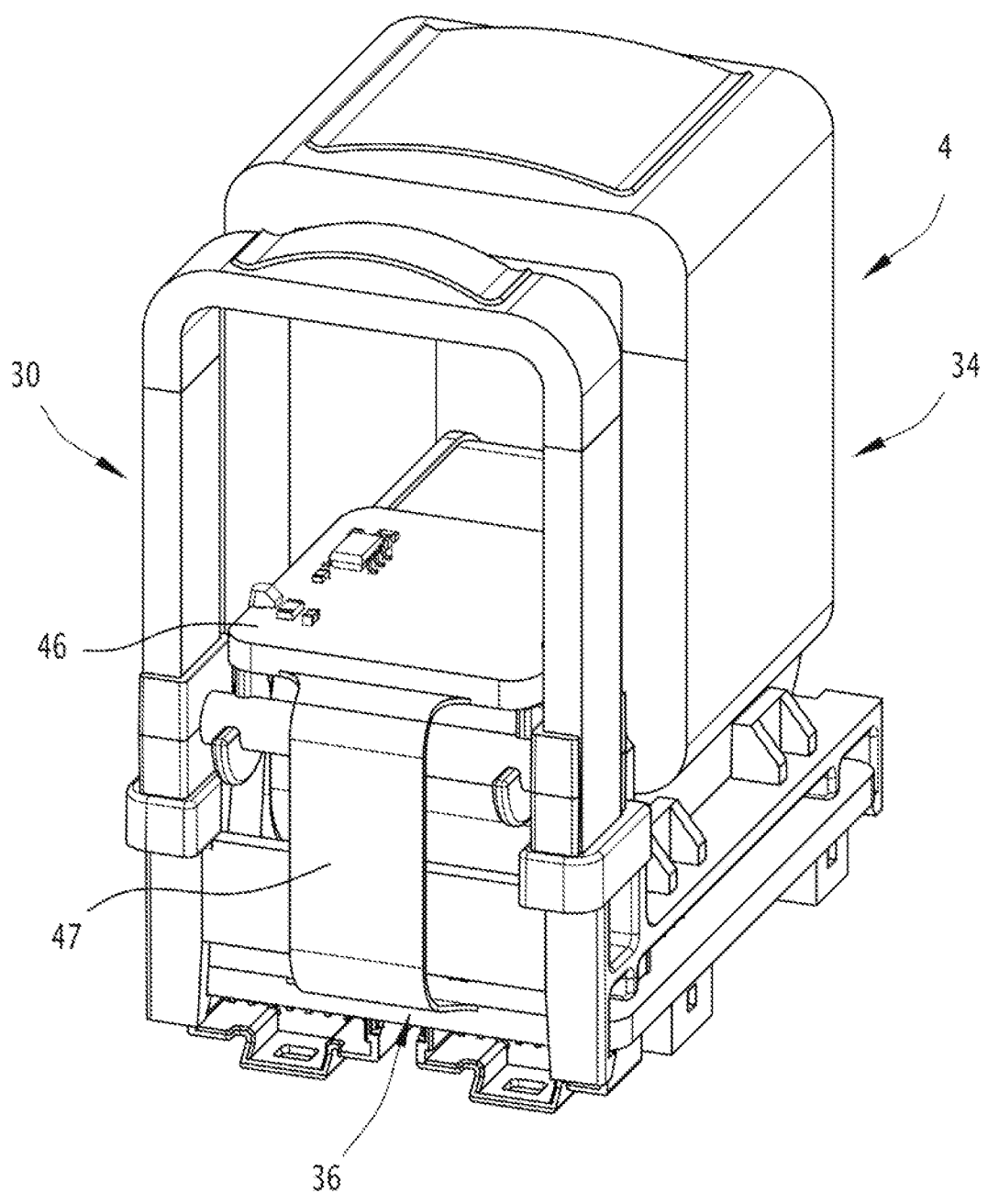
FIG. 6 is a second perspective view of a device for measuring electrical quantities, without a housing, in one embodiment.
Figure 7:
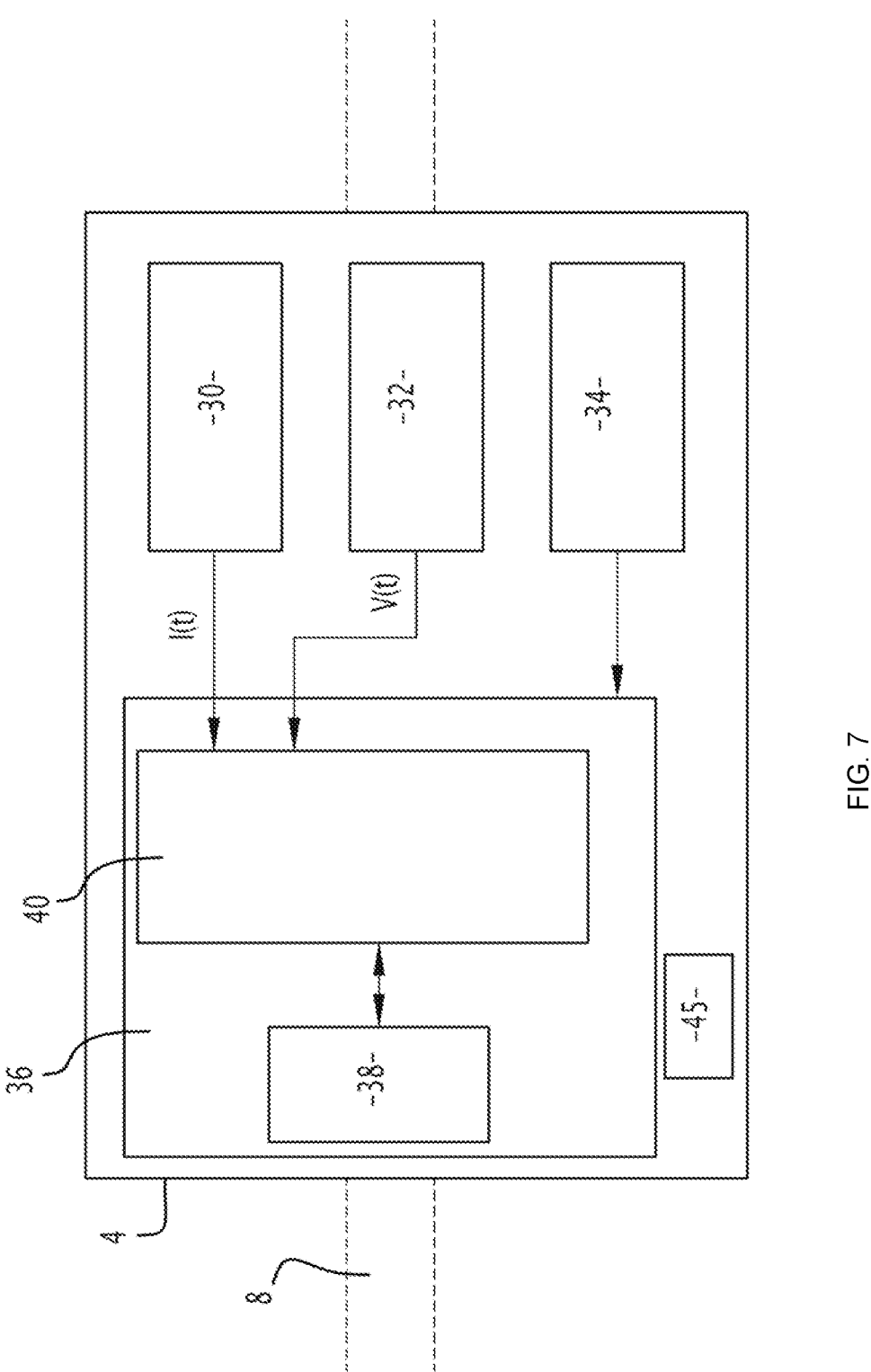
FIG. 7 is a functional block diagram of a device for measuring electrical quantities according to one embodiment.

As illustrated in more detail in FIGS. 5 and 6, according to two different spatial orientations, and functionally in FIG. 7, the device 4 for measuring physical quantities comprises:

a current measurement module 30, configured to measure an electrical current flowing in the electrical conductor that is inserted in the through-slot 22, a voltage measurement module 32 for measuring voltage through capacitive coupling, a power supply module 34, configured to pick up an electrical energy from the electrical current flowing in the electrical conductor that is inserted in the through-slot 22.

It should be noted that the components of the device 4 for measuring electrical quantities are shown in perspective in FIGS. 5 and 6, and the walls of the housing of the corresponding unitary block 20 are not shown.

The device 4 for measuring physical quantities comprises an electronic device 36, for example a printed circuit board, comprising a communication interface 38 and a programmable electronic circuit 40.

The programmable electronic circuit 40 is for example a processor, such as a microprocessor or a programmable microcontroller.

As a variant, the programmable electronic circuit 40 comprises other electronic components, such as a digital signal processor (DSP), or a field programmable gate array (FPGA), or an application-specific integrated circuit (ASIC), or any equivalent element, or any combination of these elements.

The communication interface 38 is a wireless communication interface suitable for communicating according to a predetermined wireless communication protocol, for example Bluetooth, Zigbee or Zigbee Green Power.

The programmable electronic circuit 40 is configured to receive, continuously, current and voltage measurements from the current and voltage measurement modules 30 and 32, and to control the transmission by the communication interface 38 of at least one electrical quantity associated with the electrical signal flowing in the electrical conductor received in the through-slot 22.

The electrical quantity is electrical current and/or voltage, for example.

Moreover, in some embodiments, the programmable electronic circuit 40 is configured to perform calculations that are used to obtain other electrical quantities of the electrical signal that are obtained on the basis of said current and voltage measurements, such as for example an active or reactive power, an electrical energy, a frequency, a power factor, or a harmonic distortion of the electrical signal.

The programmable electronic circuit 40 may also comprise components that are used to shape and/or filter the measurements obtained.

Moreover, the electronic device 36 comprises a clock of its own, for example an electronic oscillator, for example a crystal oscillator, such as a quartz oscillator. For example, the clock may be integrated in the microprocessor 40.

Advantageously, the power supply module 34 is suitable for supplying electricity to the electronic device 36. In other words, the device 4 for measuring electrical quantities is self-powered.

The current measurement module 30, the voltage measurement module 32 for measuring voltage through capacitive coupling and the power supply module 34 are arranged in the unitary block 20 so as to surround, fully or partly, the electrical conductor 8 when an electrical conductor is inserted in the through-slot 22.

In other words, the modules 30, 32 and 34 are arranged around the through-slot 22 intended to receive the electrical conductor 8.

In the embodiment in FIGS. 5 and 6, the electrical current measurement and power supply modules 30 and 34 are stacked one on top of the other in the direction defined by the main axis Z, the through-slot 22 being formed in this stack.

The current measurement module 30 comprises a first hollow part 42, and the power supply module 34 comprises a second hollow part 44, the respective hollow parts being centred around the main axis Z and forming the through-slot 22.

As can be seen in FIG. 6, in one embodiment the module 32 comprises a support 47 that is used to connect a voltage sensor 46 and the electronic board 36, thereby allowing electronic processing operations to be performed in the electronic board 36.

The support 47 is made of (flexible or rigid) conductive material. The sensor 46 in this embodiment is provided in the form of a printed circuit, positioned as close as possible to the electrical conductor 8, that is positioned so as to extend along one side of the through-slot 22, as illustrated in FIG. 6, for example at a distance of between 0 and 10 mm from the conductor 8. The assembly formed by the sensor 46 and the conductive support 47, and electronic processing circuits integrated in the electronic board 36, forms a voltage measurement module for measuring voltage through capacitive coupling.

In another embodiment, the sensor 46 is a metal piece arranged in the form of a half-tube having a longitudinal axis extending parallel to the main axis Z. This half-tube forms a hollow part, oriented towards the through-slot 22, that is connected via a conductor, not shown, to the electronic board 36. Thus, a contactless voltage measurement is performed. The support 47 is used to connect the sensor 46 to the electronic device 36.

Advantageously, the module 32 is provided in the first portion 24 of the unitary block 20.

Advantageously, the proposed arrangement of the respective modules is used to provide a particularly compact device 4 for measuring electrical quantities.

In the embodiment described with reference to FIG. 4, in which the device 4 for measuring electrical quantities is one that opens, each of the current measurement and power supply modules 30 and 34 are of the type that opens, that is to say designed as two at least partially separable parts.

Thus, the current measurement module 30 comprises a first part 48 and a second 50, which are at least partially separable, the first part 48 of the module 30 being accommodated in the first portion 24 of the unitary block 20, and the second part 50 of the module 30 being accommodated in the second portion 26 of the unitary block 20.

Equally, in the embodiment in FIG. 4, the power supply module 34 comprises a first part 52 and a second part 54, which are at least partially separable, the first part 52 of the module 34 being accommodated in the first portion 24 of the unitary block 20, and the second part 54 of the module 30 being accommodated in the second portion 26 of the unitary block 20.

FIG. 7 illustrates the device 2 for measuring electrical quantities in the form of a functional circuit.

Apart from the elements described hereinabove, the device 4 for measuring electrical quantities optionally comprises an interface port 45 for connecting a serial computer bus or USB (Universal Serial Bus) bus, allowing an external device to be connected. Advantageously, this allows power to be supplied to the device 4 via such an external device when the electrical conductor 8 does not carry an electrical current. For example, the external power supply is useful for initializing the communication interface 38 when the device 4 is installed by an operator. The serial connection may also be used to connect to the programmable/microprocessor/ microcontroller circuit in order to debug the system or update the firmware.

Embodiments of the current measurement 30 and power supply 34 modules are described hereinafter with reference to FIGS. 7 to 9.

Figure 8:
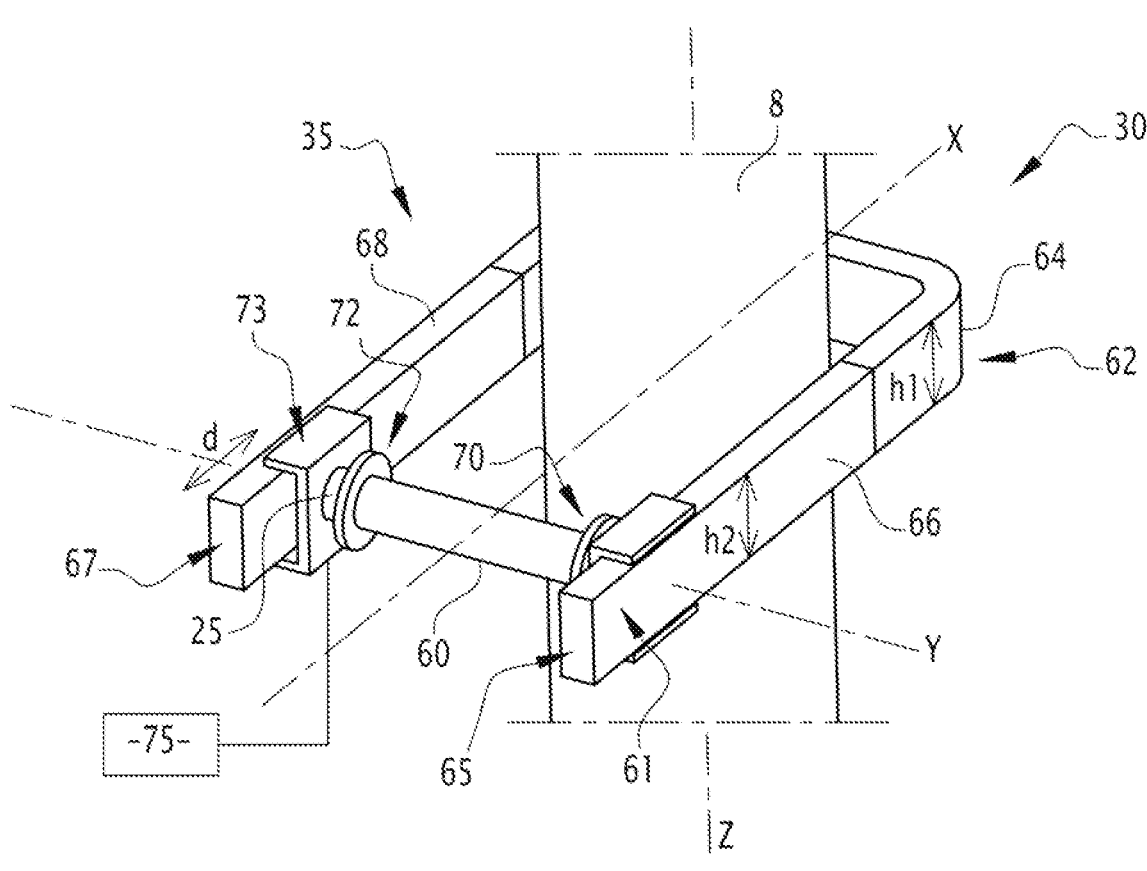
FIG. 8 is a perspective view of a current measurement module integrated in the device for measuring electrical quantities shown in FIGS. 5 and 6, according to one embodiment.

In a preferred embodiment, referring to FIG. 8, the current measurement module 30 comprises an inductive current sensor 35 comprising a main coil 60, also called a main winding 60, of linear shape, and a ferromagnetic element 62 of curved shape, thus forming a sensor referred to as a hybrid Rogowski sensor.

The main winding or coil 60 is formed for example by a conductor wire, e.g. a copper wire, wound around a support. The support is linear and of circular section, for example.

As a variant, the main winding has a curved shape; by way of example, it is formed by winding a conductor wire around a toroidal support.

By way of example, the support is made from plastic material, for example made from liquid crystal polymer (LCP).

The ferromagnetic element has an inverted "C" shape, comprising a central rounded portion 64, having an axis of symmetry X, and two arms, a first 66 and a second 68 arm, respectively, extending linearly in symmetrical fashion, parallel to the axis of symmetry X of the rounded central portion.

Thus, preferably, the ferromagnetic element has a geometric shape symmetrical about the axis of symmetry X.

In one embodiment, the central rounded portion 64 has a rectangular shape with rounded corners, in a plane referred to as transverse (X, Y plane in FIG. 8).

Advantageously, such a shape allows better compatibility with a parallelepipedal housing having rounded corners.

Nevertheless, other symmetrical shapes around the axis of symmetry X can be envisaged, for example the central rounded portion 64 has the shape of a circular arc.

Preferably, the two arms 66, 68 have the same dimensions, e.g. the same length, thickness and height.

The main winding 60 is disposed along an axis Y, orthogonal to the axis of symmetry X, in spatial proximity to the ends 65, 67 of the arms 66, 68.

For example, the main winding 60 is disposed at a distance d, in the direction of the axis of symmetry X, between the ends 65, 67 of the arms 66, 68. For example, the distance d is greater than or equal to 1 mm, preferably greater than or equal to 2 mm.

By way of example, the ferromagnetic element is made from steel, e.g. an iron-nickel or iron-silicon alloy.

The module 30 moreover comprises, optionally, compensation coils 70, 72, disposed between each end 61, 63 of the main winding 60 and the arms 66, 68 of the ferromagnetic element 62, so as to partly compensate for the play between the conductor wire and the arms 66, 68 of the ferromagnetic element, and to improve electromagnetic performance.

In one embodiment, the main winding 60 is attached to the respective arms 66, 68 by means of attachment pieces 73, which are for example made from thermoresistant material, for example made from liquid crystal polymer (LCP) plastic.

The compensation coils 70, 72 are preferably symmetrical.

The hybrid Rogowski current sensor 35 thus provided is symmetrical according to an axial symmetry about the axis X.

The module 30 moreover comprises a processing circuit 75, for example an electrical or electronic circuit, connected to the conductor wire.

In one embodiment, the processing circuit is integrated in the programmable electronic circuit 40. For example, the processing circuit comprises in particular an anti-aliasing filter, a digital-to-analogue conversion unit, a unit for integrating the electrical signal with respect to time in order to obtain a current measurement I(t), and a unit for computing electrical quantities, for example mean or mean square values of the electrical current.

The sizing of the ferromagnetic element 62 is chosen to be compatible with the dimensions of the unitary block 20.

The internal volume of the ferromagnetic element in the form of an inverted C forms a part of the through-slot 20.

Preferably, the current sensor 35 is one that opens, and is thus compatible with a device 4 for measuring electrical quantities that opens.

In one embodiment, the ferromagnetic element is separable, for example the central rounded portion 64 is separable from the respective arms 66, 68, the main winding 60, with or without compensation coils 70, 72, being attached to the arms 66 and 68, respectively. For example, the arms 66, 68 are attached to the support of the main winding using snap-riveting.

In one embodiment, the rounded central portion 64 has a height h1 and each of the arms 66, 68 has a height h2, h2 being less than h1. Advantageously, this is used to guarantee a minimum flow flowing in the sensor, while guaranteeing a minimum flow exchange surface area, and robustness towards the mechanical play between pieces.

As a variant, the heights h1 and h2 are equal.

In one embodiment, the rounded central portion 64 and the arms 66, 68 have a ferromagnetic material thickness of preferably between 1 and 5 mm.

Advantageously, the current sensor 35 is a high-gain sensor with a gain in the order of 250 µV/Amp at 50 Hz.

Thus, in one embodiment, the rounded portion 64 forms the second part 50 of the module 30 shown in FIG. 5, and the assembly formed by the arms 66, 68, the main winding 60 and the compensation coils 70, 72 form the first part 48 of the module 30.

It is advantageous to form the separation into two parts in the ferromagnetic element because the ferromagnetic element is robust vis-a-vis repeated opening and closing manipulations.

As variants, other arrangements of the separation into two parts can be envisaged.

As a variant, any other type of Rogowski sensor that opens may be used, as well as a current transformer or a Hall effect sensor.

The current sensor 35 is connected to an electrical or electronic processing circuit 75, allowing, in particular, integration to be performed in order to obtain the electrical current measurement.

In a preferred embodiment, the processing circuit 35 is integrated in the microprocessor 40 of the device 4.

Advantageously, the proposed current sensor 35 is particularly compact and robust, and allows good precision for electrical current measurement.

An embodiment of a power supply module 34 is described with reference to FIGS. 9 and 10.

The power supply module 34 is configured to collect electrical energy from the magnetic field created when the electrical conductor 8, once inserted into the slot 22 in the device 4 for measuring electrical quantities, carries an electrical current, and to provide this electrical energy to supply power to the electronic device 36 integrated in the device 4 for measuring electrical quantities.

Thus, the power supply module 34 is configured to convert an AC electrical energy into DC energy in order to supply power to a load that is the electronic device 36.

Advantageously, the device 4 for measuring electrical quantities is then self-powered and wireless, while continuously providing current and voltage measurements.

To this end, the power supply module 34 comprises a current transformation unit 80 comprising a current transformer, an AC/DC conversion unit 82 with a resonant (or non-resonant) circuit connected to the output of the current transformation unit.

Advantageously, in one embodiment, the AC/DC conversion unit 82 is a voltage doubler, for example a Greinacher voltage multiplier circuit.

Optionally, the output of the AC/DC conversion unit 82 has an impedance matching unit 84 connected to it, the output of which is connected to the input of an electrical energy storage unit 86. The impedance matching unit 84 is optional.

The module 34 moreover comprises a voltage regulating unit 88, suitable for regulating the DC voltage at the output of the power supply module 34 to suit the needs of the load.

Figure 9:
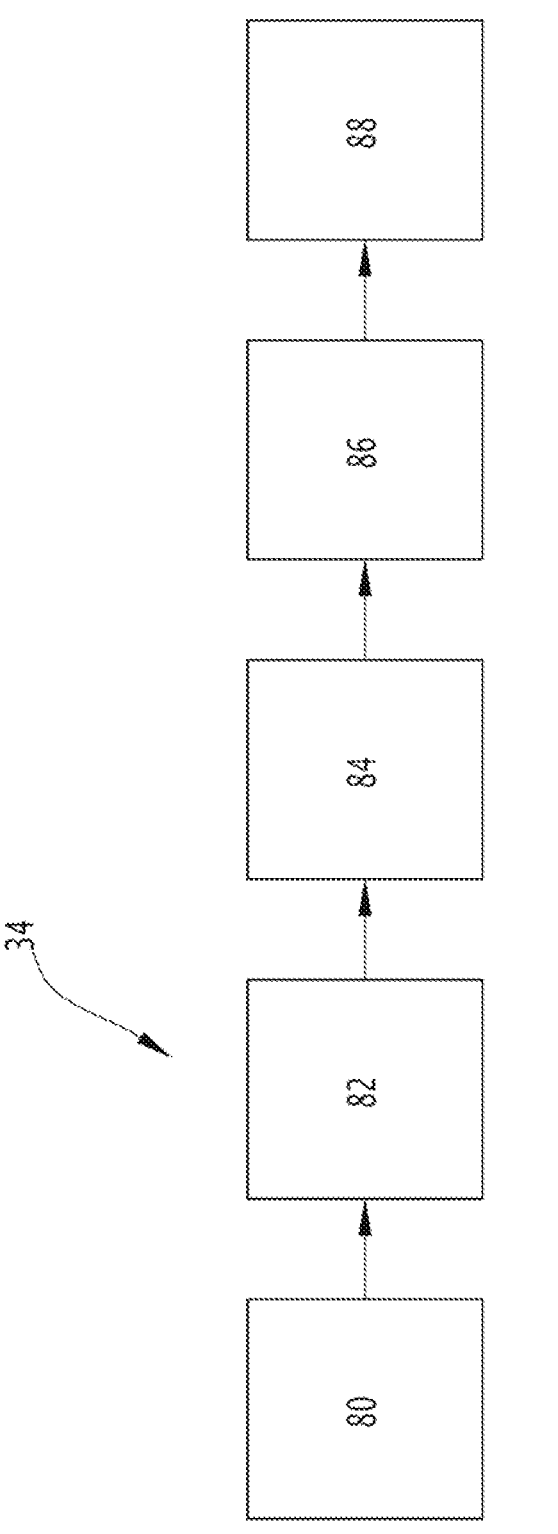
FIG. 9 is a functional block diagram of a power supply module integrated in the device for measuring electrical quantities shown in FIGS. 5 and 6, according to one embodiment.
Figure 10:
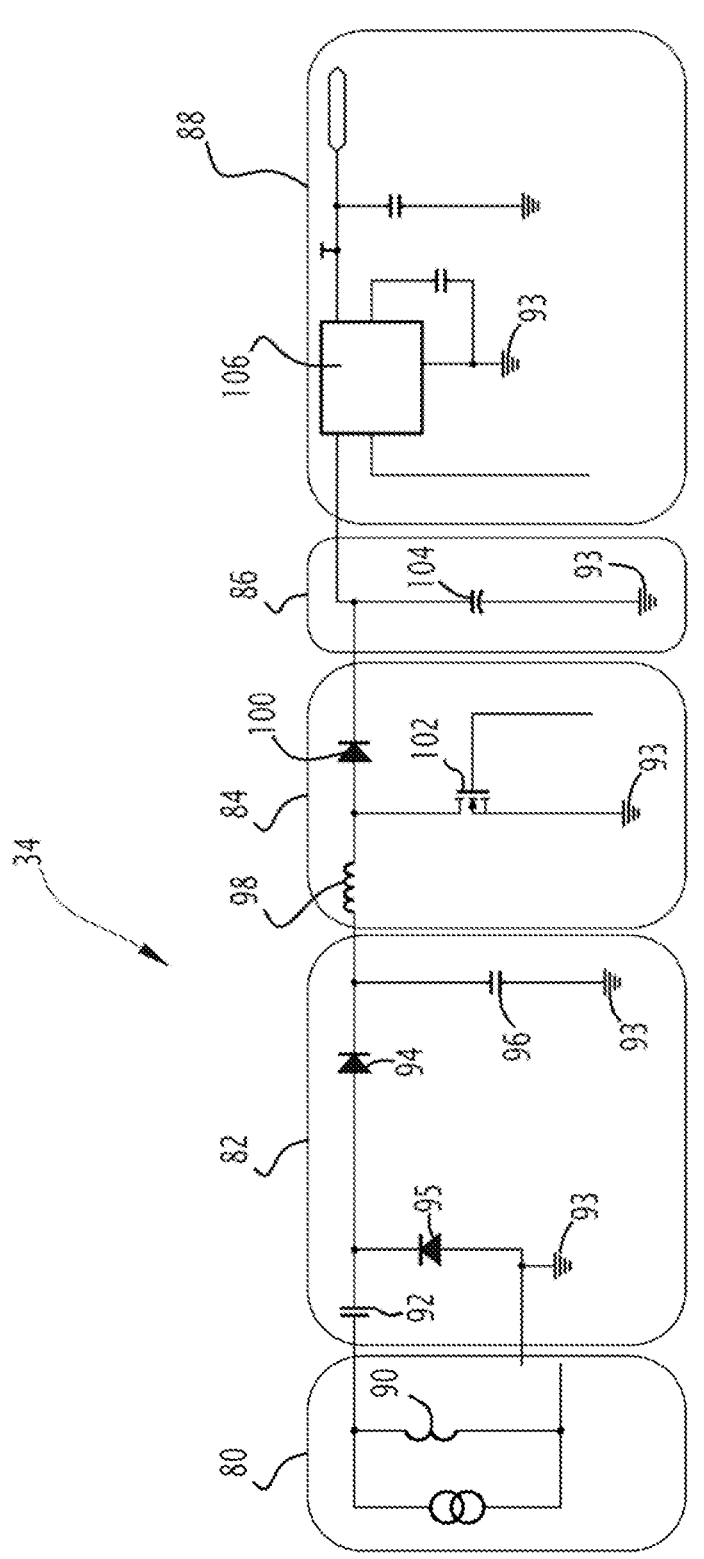
FIG. 10 is an example of circuits for producing the supply module in FIG. 9.

An example of electrical circuits that are used to provide each of the units described functionally hereinabove with reference to FIG. 9 is illustrated in FIG. 10.

The current transformation unit 80 comprising a current transformer, of magnetic current transformer type, comprises primary and secondary coils (or electrical windings), the electrical currents flowing through these coils being called the primary current and the secondary current, respectively. The secondary current is almost proportional to the primary current and out of phase therewith by an angle close to zero for an appropriate direction of the connections.

FIG. 10 shows an equivalent electrical model of a magnetic current transformer such as this, comprising a current source and an inductive component 90, called the equivalent inductive component, in parallel with the current source, the inductance L1 of which is called the equivalent magnetizing inductance of the magnetic current transformer 80.

The AC/DC conversion unit 82 comprises a capacitor referred to as a compensation capacitor 92 and a blocking diode 94 connected to the output of the compensation capacitor 92.

Furthermore, the unit 82 comprises another diode 95, connected between a point 91, which is a node between the output of the capacitor 92 and the input of the blocking diode 94, and a point 93 of low potential, for example connected to earth.

Preferably, the compensation capacitor 92 has a capacitance chosen according to the equivalent magnetizing inductance of the current transformer, so as to obtain resonance and compensate for a loss of energy due to the current transformer.

In one embodiment, the capacitance C1 of the compensation capacitor 92 is computed according to the equivalent magnetizing inductance L1 using the following formula:

$$C_1 = \frac{1}{L_1 \times \omega_0^2} \qquad \text{[MATH 1]}$$

where $\omega_0$ is the angular frequency of the AC electrical current at the output of the current transformation unit 80, where $\omega_0 = 2\pi f_0$, $f_0$ being the frequency of the electrical signal.

When the capacitance C1 of the compensation capacitor 92 is computed using the formula [MATH 1], the AC/DC conversion unit 82 is referred to as resonant with the current transformation unit 80. Furthermore, the AC/DC conversion unit moreover comprises another capacitor 96, connected between earth and the output of the blocking diode 94.

The impedance matching unit 84, in one embodiment, comprises an inductor 98 connected to the output of the unit 82, a diode 100 connected to the output of the inductor 98 and a transistor 102, connected between a node 95 situated between the output of the inductor 98 and the input of the diode 100, controlled by a control signal according to the voltage provided at the output of the module 34. The transistor 102 has a switch function.

By way of example, the transistor 102 is an N-channel MOSFET field-effect transistor.

The energy storage unit 86 comprises a storage capacitor 104 connected between the output of the impedance matching unit and earth.

The regulating unit comprises a regulator 106 and, optionally, additional capacitors for energy regulation.

Implementation variants for the various units 80, 82, 84, 86 and 88 using electrical circuits are applicable.

Advantageously, in one embodiment, the current transformation unit 80 is provided in the form of windings associated with a ferromagnetic element, and the AC/DC conversion unit 82, the optional impedance matching unit 84, the electrical energy storage unit 86 and the voltage regulating unit 88 are integrated in the programmable electronic circuit 40 (e.g. the microprocessor) of the device 4.

For example, in one embodiment, a part of the magnetic current transformer of the current transformation unit 80 is integrated in the first part 52 and the second part 54 of the module 34 is formed by a ferromagnetic element of the magnetic current transformer of the current transformation unit 80. Preferably, the first and second parts are at least partially separable, the power supply module 34 then being one that opens.

Advantageously, the use of a Greinacher voltage doubler allows compensation for losses caused by the equivalent magnetizing inductance of the current transformation unit.

Advantageously, moreover adding an impedance matching unit allows the provision of electrical energy by the power supply module 34 to be optimized, while allowing the size of this module to be reduced.

This then allows easy integration into a unitary block 20, for example having dimensions smaller than 50 mm per dimension, for example of the order of 40×45×26 mm.

Thus, the invention is used to provide a device for measuring electrical quantities that is particularly compact, able to communicate and has an independent power supply.

The invention claimed is:

1. A device for measuring electrical quantities in an electrical installation, said device being integrated in a housing comprising at least one unitary block, the unitary block comprising a through-slot suitable for receiving an electrical conductor of the electrical installation, the through-slot extending along a main axis through opposing sides of the unitary block so that the electrical conductor extends through the opposing sides of the unitary block when received in the through-slot, wherein the unitary block comprises:

a current measurement module, configured to measure an electrical current flowing in said electrical conductor, a voltage measurement module for measuring voltage through capacitive coupling, a power supply module, configured to pick up an electrical energy from said electrical conductor, said modules being arranged around said through-slot so that the current measurement module, the voltage measurement module, and the power supply module are configured to be arranged around the electrical conductor when received in the through-slot, the unitary block moreover comprising an electronic device, comprising a wireless communication interface suitable for communicating according to a predetermined wireless communication protocol and a programmable electronic circuit, and the electronic device being supplied with electrical energy by said power supply module, the programmable electronic circuit being configured to receive, continuously, current and voltage measurements from said current and voltage measurement modules, and to control the transmission by said communication interface of at least one electrical quantity associated with the electrical signal flowing in the electrical conductor received in the through-slot, which electrical quantity is obtained on the basis of said current and voltage measurements.

2. The device according to claim 1, wherein said electrical quantity is a current, a voltage, an active or reactive power, an electrical energy, a frequency, a power factor, or a harmonic distortion of the electrical signal.

3. The device according to claim 1, wherein the unitary block is arranged as a first portion and a second portion put together, said first and second portions being at least partially separable from one another, so as to allow said unitary block to be opened and closed, said first and second portions cooperating to form the through-slot.

4. The device according to claim 3, wherein said first and second portions are linked by at least one pivot having two axes of rotation.

5. The device according to claim 1, wherein the current measurement module and the power supply module are stacked in the direction defined by the main axis, and wherein the module comprises a first hollow part and the power supply module comprises a second hollow part, said first and second hollow parts being centered around the main axis and forming the through-slot.

6. The device according to claim 1, wherein the voltage measurement module comprises a sensor extending in the through-slot in the direction of the main axis and a support connected to said sensor and to the electronic device, forming a voltage sensor through capacitive coupling with the electrical conductor.

7. The device according to claim 1, wherein the current measurement module comprises a current sensor, the current sensor comprising a main coil of conductor wire, and a ferromagnetic element of curved shape, comprising a rounded central portion and two arms of the same length extending on either side of the rounded central portion, the ferromagnetic element having an axis of symmetry parallel to each of the arms, the main coil extending in a direction perpendicular to said axis of symmetry, and being disposed between said arms of the ferromagnetic element.

8. The device according to claim 7, wherein the current sensor is configured to open into two parts, a first part comprising at least the main coil and said arms, and a second part comprising the rounded central portion.

9. The device according to claim 7, wherein the main coil has a first end and a second end, said arms of the ferromagnetic element being a first arm and a second arm, respectively, the sensor moreover comprising compensating coils, disposed on either side of the main coil, between the first end of the main coil and the first arm and between the second end of the main coil and the second arm, respectively.

10. The device according to claim 1, wherein the power supply module comprises a current transformation unit comprising a magnetic current transformer having an equivalent magnetizing inductance, an AC/DC conversion unit comprising a compensating capacitor, referred to as a compensation capacitor, configured to compensate for a loss of energy due to the magnetic current transformer, and an electrical energy storage unit.

11. The device according to claim 10, wherein the power supply module moreover comprises an impedance matching unit connected between the conversion unit and the energy storage unit.

12. The device according to claim 10, wherein the conversion unit is a voltage multiplier unit comprising the compensation capacitor and a blocking diode connected to the output of the compensation capacitor, the compensation capacitor having a capacitance chosen to compensate for the equivalent magnetizing inductance of the magnetic current transformer.

13. A system for computing electrical quantities in an electrical installation, comprising a plurality of devices for measuring electrical quantities according to claim 1 and a gateway communication device, which are configured to communicate according to a chosen wireless communication protocol.

14. A device for measuring electrical quantities in an electrical installation, said device being integrated in a housing comprising at least one unitary block, the unitary block comprising a through-slot suitable for receiving an electrical conductor of the electrical installation, the through-slot extending along a main axis, wherein the unitary block comprises:

a current measurement module, configured to measure an electrical current flowing in said electrical conductor, a voltage measurement module for measuring voltage through capacitive coupling, a power supply module, configured to pick up an electrical energy from said electrical conductor, said modules being arranged around said through-slot intended to receive the electrical conductor, and the current measurement module and the power supply module being stacked in the direction defined by the main axis, the unitary block moreover comprising an electronic device, comprising a wireless communication interface suitable for communicating according to a predetermined wireless communication protocol and a programmable electronic circuit, and the electronic device being supplied with electrical energy by said power supply module, the programmable electronic circuit being configured to receive, continuously, current and voltage measurements from said current and voltage measurement modules, and to control the transmission by said communication interface of at least one electrical quantity associated with the electrical signal flowing in the electrical conductor received in the through-slot, which electrical quantity is obtained on the basis of said current and voltage measurements.

15. The device according to claim 14, wherein the unitary block is arranged as a first portion and a second portion put together, said first and second portions being at least partially separable from one another, so as to allow said unitary block to be opened and closed, said first and second portions cooperating to form the through-slot.

16. The device according to claim 15, wherein said first and second portions are linked by at least one pivot having two axes of rotation.

17. The device according to claim 15, wherein the module comprises a first hollow part and the power supply module comprises a second hollow part, said first and second hollow parts being centered around the main axis and forming the through-slot.

18. A device for measuring electrical quantities in an electrical installation, said device being integrated in a housing comprising at least one unitary block, the unitary block comprising a through-slot suitable for receiving an electrical conductor of the electrical installation, the through-slot extending along a main axis, wherein the unitary block comprises:

a current measurement module, configured to measure an electrical current flowing in said electrical conductor, the current measurement module comprising a current sensor that comprises a main coil of conductor wire, and a ferromagnetic element, the ferromagnetic element comprising:

a rounded central portion;

two arms extending on either side of the rounded central portion, and an axis of symmetry parallel to each of the arms, the main coil extending in a direction perpendicular to said axis of symmetry, and being disposed between said arms of the ferromagnetic element, a voltage measurement module for measuring voltage through capacitive coupling, a power supply module, configured to pick up an electrical energy from said electrical conductor, said modules being arranged around said through-slot intended to receive the electrical conductor, the unitary block moreover comprising an electronic device, comprising a wireless communication interface suitable for communicating according to a predetermined wireless communication protocol and a programmable electronic circuit, and the electronic device being supplied with electrical energy by said power supply module, the programmable electronic circuit being configured to receive, continuously, current and voltage measurements from said current and voltage measurement modules, and to control the transmission by said communication interface of at least one electrical quantity associated with the electrical signal flowing in the electrical conductor received in the through-slot, which electrical quantity is obtained on the basis of said current and voltage measurements.

19. The device according to claim 18, wherein the current sensor is configured to open into two parts, a first part comprising at least the main coil and said arms, and a second part comprising the rounded central portion.

20. The device according to claim 19, wherein the main coil has a first end and a second end, said arms of the ferromagnetic element being a first arm and a second arm, respectively, the current sensor further comprising compensating coils, disposed on either side of the main coil, between the first end of the main coil and the first arm and between the second end of the main coil and the second arm, respectively.

* * * * *